(12) United States Patent
Parat et al.

(10) Patent No.: US 6,949,801 B2
(45) Date of Patent: Sep. 27, 2005

(54) DUAL TRENCH ISOLATION USING SINGLE CRITICAL LITHOGRAPHIC PATTERNING

(75) Inventors: Krishna Parat, Palo Alto, CA (US); Kiran Pangal, San Jose, CA (US); Allen Lu, San Mateo, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/669,825

(22) Filed: Sep. 23, 2003

(65) Prior Publication Data

US 2004/0058508 A1 Mar. 25, 2004

Related U.S. Application Data

(62) Division of application No. 10/141,545, filed on May 7, 2002, now Pat. No. 6,849,518.

(51) Int. Cl.⁷ ............................................. H01L 29/76
(52) U.S. Cl. ..................... 257/374; 438/427; 438/241; 438/424
(58) Field of Search ......................... 257/374, 69, 517, 257/526, 774, 797; 438/427, 241, 424

(56) References Cited

U.S. PATENT DOCUMENTS

| | | | | |
|---|---|---|---|---|
| 5,382,541 A | * | 1/1995 | Bajor et al. | |
| 5,895,253 A | * | 4/1999 | Akram | 438/424 |
| 6,184,107 B1 | * | 2/2001 | Divakaruni et al. | 438/427 |
| 6,294,423 B1 | * | 9/2001 | Malik et al. | 438/241 |
| 6,297,127 B1 | * | 10/2001 | Chen et al. | 257/69 |
| 6,413,835 B1 | * | 7/2002 | Norstrom et al. | 438/424 |
| 6,461,934 B2 | * | 10/2002 | Nishida et al. | 438/424 |
| 6,649,975 B2 | * | 11/2003 | Baliga | 257/330 |
| 2005/0020003 A1 | * | 1/2005 | Johansson et al. | 438/207 |

* cited by examiner

*Primary Examiner*—Luan Thai
(74) *Attorney, Agent, or Firm*—Blakely, Sokoloff, Taylor & Zafman LLP

(57) ABSTRACT

A method and apparatus for forming shallow and deep isolation trenches in a substrate so that the shallow and deep isolation trenches are aligned without mis-registration. The method includes forming a plurality of shallow trenches, covering a portion of the plurality of shallow trenches, then etching the uncovered shallow trenches to create deeper trenches.

24 Claims, 16 Drawing Sheets

DUAL TRENCH ISOLATION USING SINGLE CRITICAL LITHOGRAPHIC PATTERNING

This is a Divisional application of Ser. No.: 10/141,545 filed May 7, 2002, which is now U.S Pat. No. 6,849,518.

FIELD OF THE INVENTION

The present invention relates generally to the field of semiconductor processes and, more specifically, to the formation of isolation regions on a substrate.

BACKGROUND OF THE INVENTION

Integrated circuits (ICs) have numerous interconnecting devices built into a silicon substrate. These devices must be separated, or isolated, to ensure that they function properly, independent of each other. As the need for faster ICs increases, so does the need to be able to place the IC devices closer to each other. As the devices get closer, the need to properly isolate them from each other becomes more critical. To this end, isolation technology has become one of the critical aspects of fabricating ICs.

A conventional process of isolating devices on a flash memory IC is depicted in FIGS. 1A–1B. Referring first to FIG. 1A, the conventional process begins by growing a pad-oxide layer 113 followed by depositing a mask layer 112, such as silicon nitride, which acts as an oxidation barrier layer as well as a polish stop layer on a silicon substrate 110 to form an IC wafer 114. The wafer 114 is divided into two types of regions—array regions where arrays of memory devices will be formed, and periphery regions where the logic devices to control the memory devices will be formed.

A photoresist layer is then formed and patterned to create overlaying photoresist masks 120 on the mask layer 112. As shown in FIG. 1B, trenches 124 are then etched into the silicon substrate 110. Integrated devices can be formed on the raised substrate regions 126 between the trenches 124. The raised substrate regions 126 are known in the art as active regions. Thus, the conventional process uses the same depth trench in both the array and the periphery regions.

A single-depth trench process, however, is sub-optimal for circuits where it may be beneficial to have shallow trenches in the array regions but deeper trenches in the periphery regions. For example, in the array region, smaller trench depths may allow for improved trench fill, preventing voids that result in trenches with a high-aspect ratio. Shallower trench depths may also result in lower resistances in source-rail configurations connecting Flash memory devices, for instance. At the same time, however, trenches may need to be formed in the periphery area that are sufficiently deep to adequately isolate neighboring devices. Hence, an optimized process may include forming shallow trenches and deep trenches on the same substrate.

One process to form shallow trenches in the array regions and deeper trenches in the periphery regions may include steps as shown in FIGS. 1C–1F. Referring first to FIG. 1C, this process may begin by forming a pad-oxide layer 113 on a silicon substrate 110, and a mask layer 112, such as silicon nitride, on the pad-oxide layer 113, to form the IC wafer 114. The wafer 114 is divided into two types of regions—array regions for the formation of memory devices, and periphery regions for the formation of logic devices to control the memory devices. A photoresist layer is then formed and patterned to create overlaying photoresist masks 120 on the mask layer 112. As shown in FIG. 1D, shallow trenches 125 are then etched into the silicon substrate 110 in the array regions.

After stripping the first photo resist mask from the wafer, the optimized process may then continue, as shown in FIG. 1E, with performing a second critical lithography process to pattern photoresist masks 128 on the periphery regions. As ICs get denser with devices, the minimum size features of those devices get smaller and tighter. These minimum size features, or critical dimensions (CD), must be controlled very carefully. To later form devices with the least amount of design error, the photoresist masks 128 on the periphery area would need to be aligned to the array trenches 128 as closely as possible. Therefore, the formation and patterning of the second photoresist layer would require a "critical" lithography process requiring the need for critical steppers. Deep depth trenches 130 would then be etched into the silicon substrate 110 in the periphery, as shown in FIG. 1D. Logic devices could be formed on the raised substrate regions 132 between the deep trenches.

The optimized process, however, also suffers from serious problems. First, because the shallow trenches are formed independently from the deep trenches, the current process requires the use of a second critical lithography process to position the second photoresist masks 128. The second critical lithography process would be required to maintain critical CD control for the periphery area. A critical lithography process requires the use of complex and precise tools that are expensive.

Second no two lithography processes, not even critical lithography processes, can be performed without producing some mis-registration, or overlay error. This mis-registration must be taken into account in the design, thus making the design rules looser, to compensate for the overlay error.

Third, when patterning the deeper trenches 130, the wafer 114 is not planar since the shallow trenches 124 are already formed into the wafer 114. This non-planarity can lead to poor lithography control in the periphery regions.

BRIEF DESCRIPTION OF THE DRAWINGS

The present invention is illustrated by way of example and not limited by the figures of the accompanying drawings in which like references indicate similar elements and in which.

DETAILED DESCRIPTION OF THE INVENTION

The present invention is a novel dual trench isolation scheme using one critical lithographic patterning and one non-critical lithography patterning to define shallow and deep isolation trenches. In the following description numerous specific details are set forth in order to provide a through understanding of the present invention. One of ordinary skill in the art, however, will appreciate that these specific details are not necessary to practice the present invention. While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In other instances well known semiconductor fabrication processes, techniques, materials, equipment, etc., have not been set forth in particular detail in order to not unnecessarily obscure the present invention.

The present invention is a method for forming shallow and deep isolation trenches in a substrate so that the shallow and deep isolation trenches are self-aligned to each other, without mis-registration, and formed with less cost. The method includes forming a plurality of shallow trenches, covering a portion of the plurality of shallow trenches, then etching the uncovered shallow trenches to create deeper trenches. A mask layer protects active regions, in the uncovered portion, from being etched. The result is an isolation structure that completely aligned shallow and deep trenches.

Method

Figure 1A:
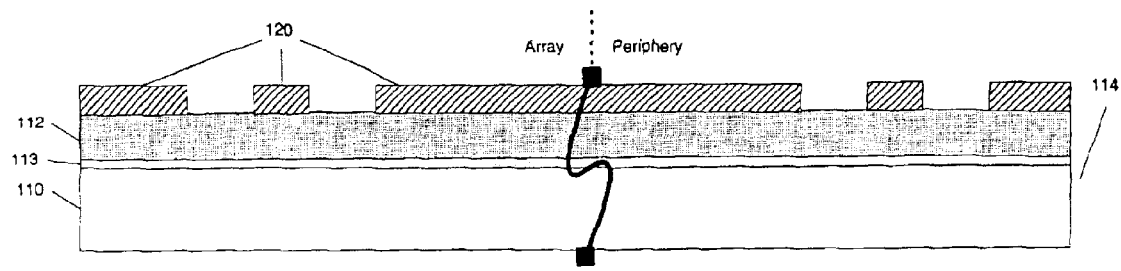
FIGS. 1A–1B represent a conventional process of forming isolation trenches.
Figure 1B:
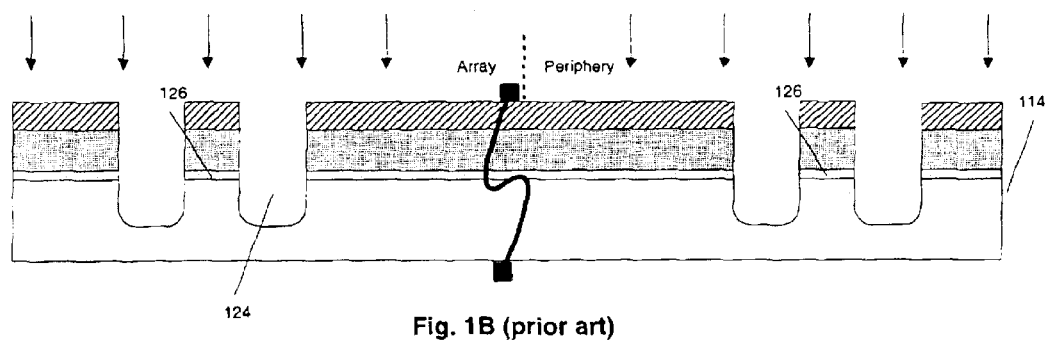
Figure 1C:
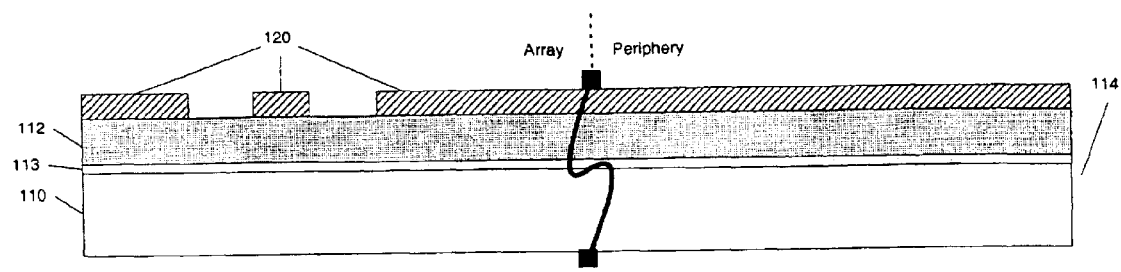
FIGS. 1C–1F represent a version of the conventional process of forming shallow and deep isolation trenches in a substrate.
Figure 1D:
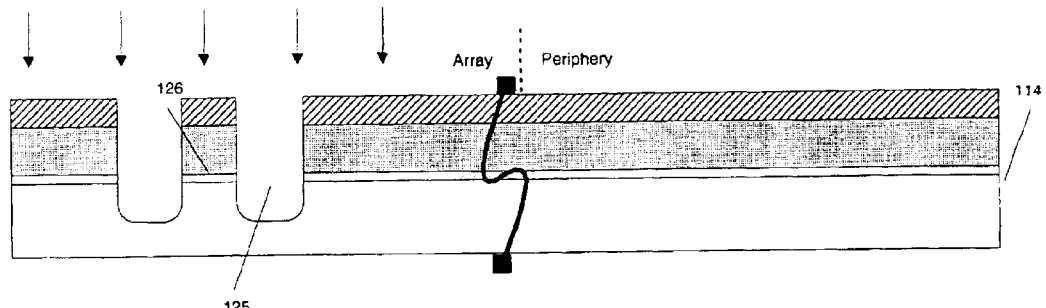
Figure 1E:
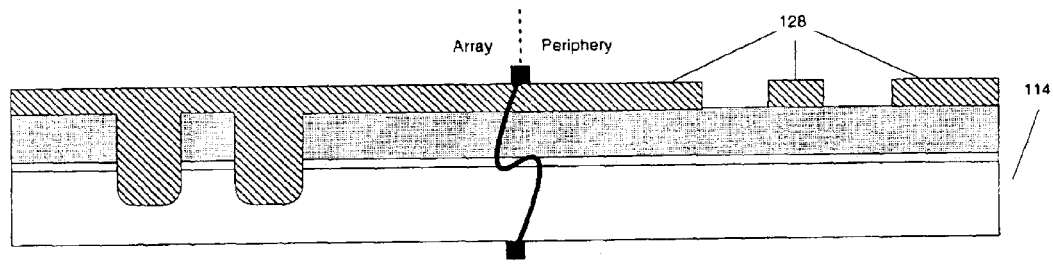
Figure 1F:
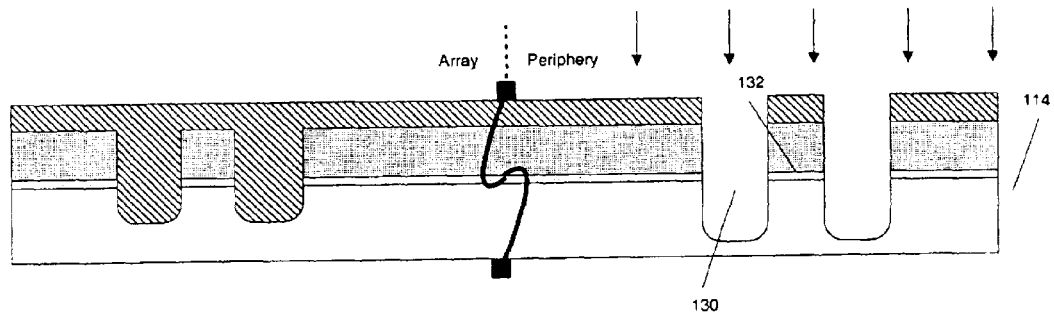
Figure 2A:
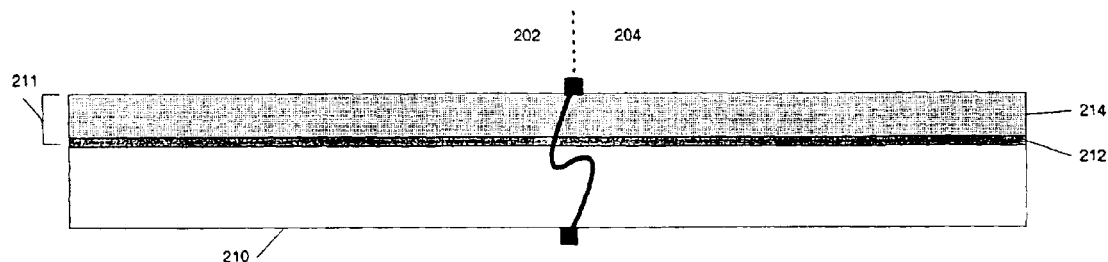
FIGS. 2A–2M represent an embodiment of a method of forming self-aligned shallow and deep isolation trenches, according to the present invention.

FIGS. 2A–2M represent an embodiment of a method of forming self-aligned shallow and deep isolation trenches. The method begins, as shown in FIG. 2A, by forming a mask layer 211 on a substrate 210, with the substrate 210 having first and second regions 202 and 204. The substrate 210, in one embodiment of the invention, may be a monocrystalline silicon substrate, but, can be other types of substrates. The mask layer 211 has several functions described in further detail below. For instance, as described in conjunction with FIG. 2H, the mask layer 211 functions as an etch stop to protect the substrate 210 during a subsequent trench etch. Consequently, mask layer 211 may be defined as an etch-stop layer. In FIG. 2J, the mask layer 211 functions as an oxidation barrier to protect the substrate from oxidation during a subsequent formation of a thermal oxide. Consequently, mask layer 211 may be defined as an oxidation barrier layer. Furthermore, in FIG. 2L, the mask layer 211 functions as a polish stop to protect the substrate 210 during a subsequent chemical-mechanical polish. Consequently, mask layer 211 may be defined as a polish-stop layer.

In one embodiment of the invention, the mask layer 211 may be a composite of different layers. For instance, the mask layer may include a pad oxide layer 212 thermally grown on the substrate 210 and a silicon nitride layer 214 formed on the pad oxide layer 212. The pad oxide layer 212 is to relieve stress between the substrate 210 and the nitride layer 214. The nitride layer 214, therefore, would function as the etch-stop layer, the polish-stop layer, and the oxidation barrier layer. Therefore, in the embodiments discussed in conjunction with FIGS. 2A–2M, the term "nitride layer" will synonymously replace the term "mask layer"; however, it should be understood that the mask layer 211 may be any other material, other than a nitride, that can act as an etch stop, a polish stop, or an oxidation barrier during the subsequently described processes.

Figure 2B:
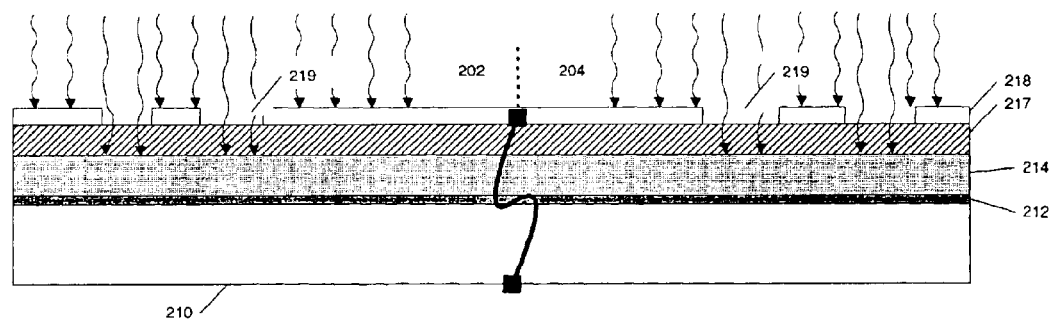

The method continues, as shown in FIG. 2B, with forming a first photoresist layer 217 over the nitride layer 214. According to well known photolithography techniques, a reticle 218 is positioned over the photoresist layer 217, wherein the reticle 218 has openings 219 formed therein according to a predetermined design. The photoresist layer 217 is then exposed to a form of light energy, typically photonic or ultraviolet light, wherein the light energy changes the composition of the photoresist layer 217 directly underneath the openings 219.

Figure 2C:
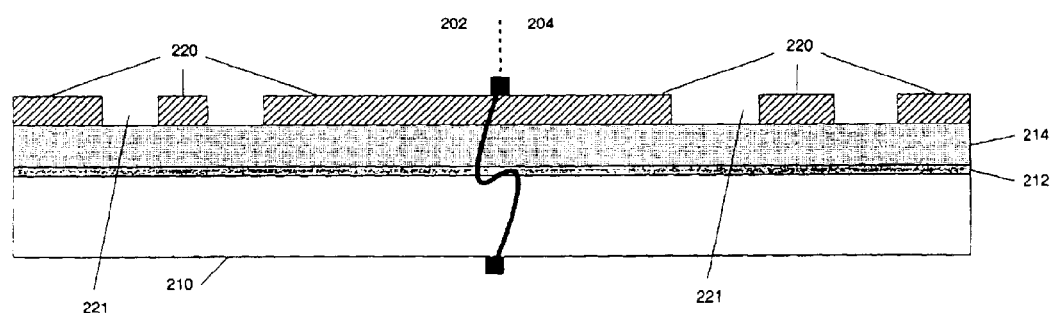

The photoresist layer is developed, according to typical lithography techniques, as shown in FIG. 2C, to form a photoresist-mask layer 220 over the first and second regions, 202 and 204. Openings 221 in the photoresist-mask layer 220 define locations where isolation trenches will subsequently be formed. Eventually, trenches will be formed by etching at the openings through the nitride 214, pad oxide 212, and substrate 210 layers. However, via various design and fabrication techniques, the trenches in the first area 202 will be shallower than the trenches in the second area 204. Hence, the pattern of the photoresist-mask layer 220 over the first area may include openings 221 that are closer in width than those openings 221 in the second area.

In one embodiment of the invention, the photoresist mask layer 229 is patterned. The patterning may be done using a critical lithography process. For the purposes of the present invention, a critical lithography process is defined as a process of forming and patterning a photoresist layer by utilizing "critical" masking, alignment, exposure, development, or inspection procedures. Critical dimensions are the dimensions that define the minimum features, such as line width, and spacing, etc., for photoresist-mask layer 220. Hence, a critical lithography process attempts to maintain very tight design tolerances by shaping the photoresist mask 220 and spacing the openings 221 as cleanly and precisely as possible to ensure that the isolation trenches to be formed will be formed as cleanly and precisely as possible.

Figure 2D:
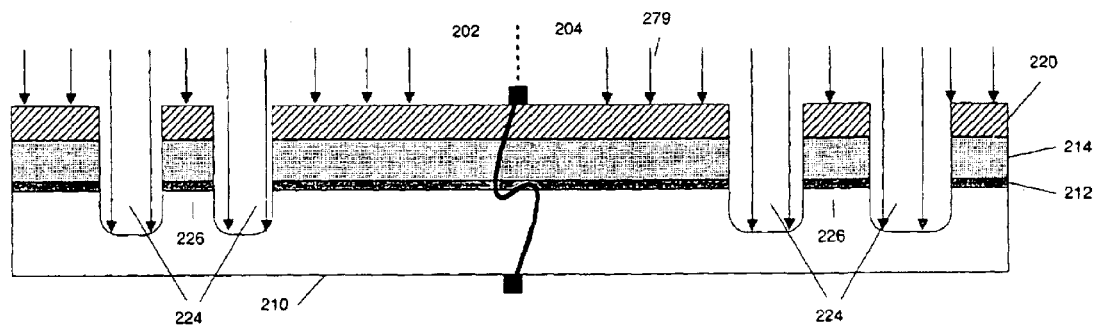

The method continues, as shown in FIG. 2D, with etching the nitride layer 214, the pad oxide layer 212, and the substrate 210, between the openings 221, to a first depth, to form a plurality trenches 224 in the substrate. Etchant 279 should be able to etch through the nitride layer 214, the pad oxide layer 212, and the substrate 210 underneath the openings 221. If the substrate 210 is silicon, etchant 279 should be able to etch through silicon. Furthermore, the photoresist-mask layer 220 protects the underlying nitride layer 214, pad oxide layer 212, and substrate 210 where there are no openings. Consequently, photoresist mask layer 220 should be resistant to etchant 279. In one embodiment of the invention, etchant 279 may utilize several different chemistries such as HBr, C2F6, CHF3 for etching the nitride layer 214, HBr, C2F6, CHF3, for etching the pad oxide layer 212, and HBr, Cl2, CF4, He and O2 for etching the silicon substrate 210. One skilled in the art will recognize, however, that any variety of different etch chemistries may be employed.

The plurality of trenches 224 define a plurality of substrate structures 226 covered by the pad oxide layer 212, the nitride layer 214 and the photoresist-mask layer 220. In one embodiment of the invention, active devices will subsequently be built on the substrate structures 226, hence substrate structures 226, may also be referred to herein as "active regions". The trenches should be deep enough to prevent one device from interfering with neighboring device in the substrate. However, it is often beneficial to use shallow depth trenches. For example, in the array region, smaller trench depths may allow for improved trench gap-fill, preventing voids that result in trenches with an otherwise high-aspect ratio (depth/width ratio). Shallower trench depths may also result in much lower resistances in source-rail configurations connecting Flash memory devices, for instance. At the same time, however, trenches may need to be formed in the periphery area that have sufficiently deep trenches to adequately isolate neighboring devices. Therefore, in one embodiment of the invention, the trenches 224 should could be etched to between approximately 1000 Å to 2000 Å in depth, or a depth that is minimally sufficient to isolate the drain junctions, for instance, of two adjacent Flash cells.

Figure 2E:
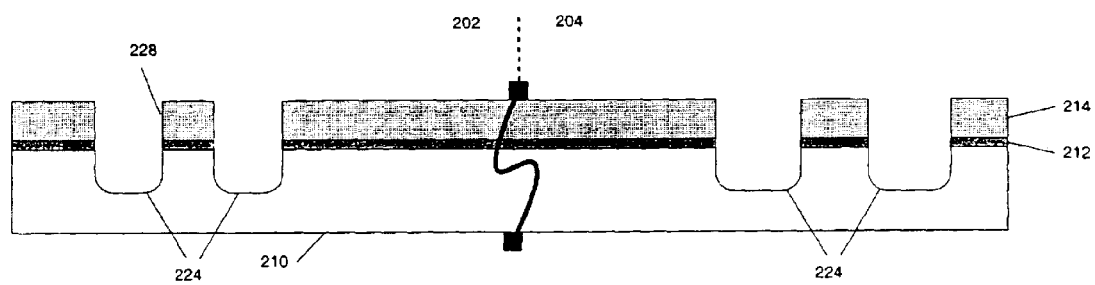
Figure 2F:
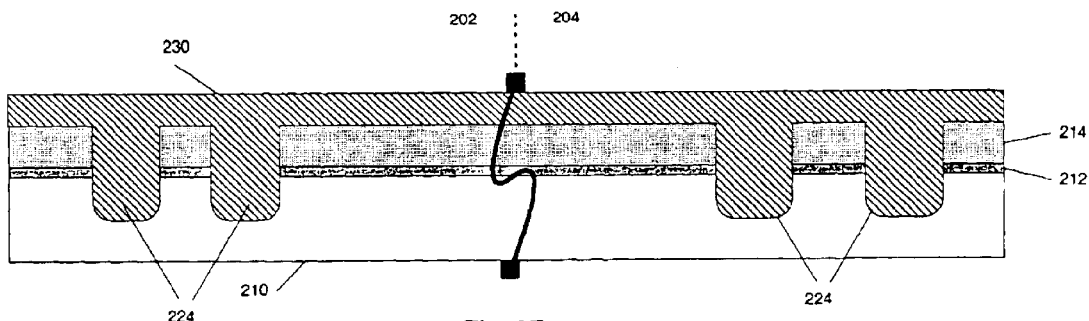

The method continues with removing the photoresist-mask layer 220, as shown in FIG. 2E, and depositing a second photoresist layer 230 over the first area 202 and second area 204, as shown in FIG. 2F.

Figure 2G:
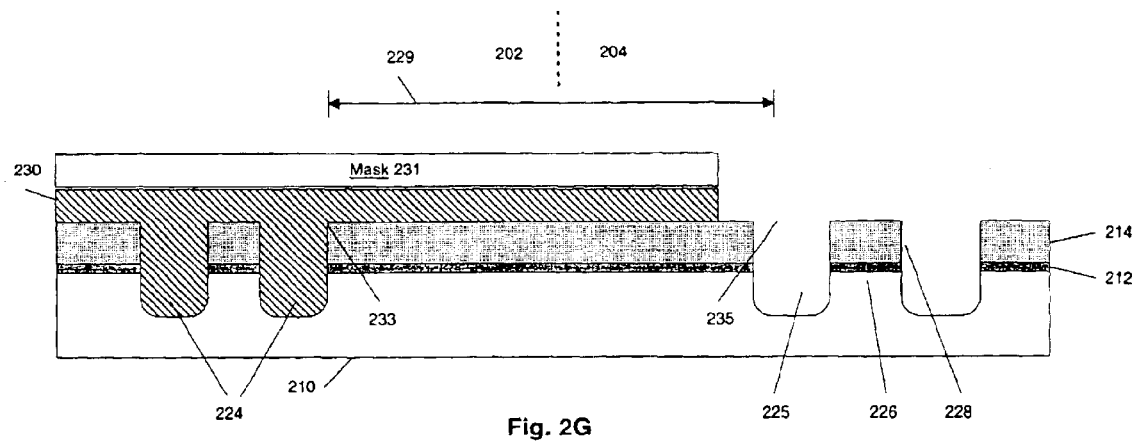

Next, as shown in FIG. 2G, photoresist 230 is masked, exposed and developed, according to conventional photolithography techniques, so that the trenches 224 in the first area 202 are covered and the trenches 224 in the second area 204 are exposed. An advantage of the present invention is that the masking of the second photoresist layer 230 can be done using a non-critical lithography process. For example, in one embodiment of the invention, as shown in FIG. 4, the second area 204 may be a periphery area 404 where logic devices 458 are constructed while the first area 202 may be a memory array 402 where memory devices 428 are constructed. The memory chips are designed in such a way that there are arrays of contiguous memory devices 428 and adjacent to these memory arrays are the logic devices 458, which read, write, or in other ways control the memory devices 428. The logic devices 458, which read, write, or in other ways control the memory devices 428, do not need to be as close to memory devices 428 as the memory devices are to each other. Thus, referring back to FIG. 2G, the distance 229 between the edge 233 of the last trench in the first area 202 and the edge 235 of the first trench in the second area 204 is relatively large compared to the spacing between the trenches within the first area itself. Therefore, the mask 231 can be aligned to the edge 233 of the last trench in the first area 202 and positioned with an overlay error as much as the distance 229 and still cover the trenches in the first area 202 while leaving the trenches in the second area 204 uncovered. As long as the distance 229 is not smaller than the allowable error produced by a non-critical mask, currently 150 nm to 300 nm, then the second photoresist layer 230 can be aligned and positioned with a non-critical lithography process. One skilled in the art will recognize, however, that design tolerances will improve in time, and that the invention is not limited to the tolerances available to current lithographic processes.

Figure 2H:
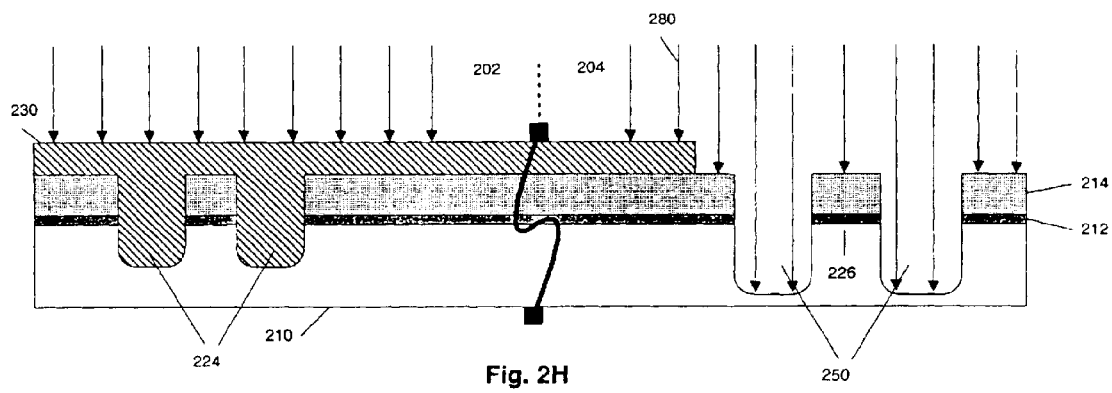

The method continues, as shown in FIG. 2H, with etching the exposed trenches 224 in the second area 204 to a second depth, to form deep trenches 250. Therefore, the method has produced shallow trenches 224 and deep trenches 250 that are perfectly aligned to each other. There was no need for a critical lithography process to align the deep trenches 250 to the shallow ones 224, as done in conventional processes.

The deep trenches 250 must have a depth sufficient to isolate neighboring device junctions in the second area 204 from interfering with each other. Deep trenches 250 may be referred to as "deep isolation trenches," while the shallow trenches 224 may be referred to as "shallow isolation trenches."

During the etching of the deep trenches 250, the nitride layer 214 protects the active regions 226 in the second area 204 from being etched, while the photoresist layer 230 protects everything in the first area 202 from being etched. Essentially, the nitride layer 214 acts as a mask layer to the enchants 280, so that the active regions 226 are not etched. Thus, the second photoresist layer 230, formed in the last step, does not need to cover the second area 204, only the first area 202, so that the substrate 210 in the shallow trenches 224 is not etched away by etchant 280, and shallow trenches 224 can maintain their shallow depth. The substrate 210 in the second area 204, however, is exposed to the etchant 280, and is therefore etched to a deeper depth. Therefore, the chemistry of the etchant 280 must be able to etch the substrate material (e.g. silicon) yet at the same time not etch the nitride layer 214 or the photoresist layer 230.

Figure 2I:
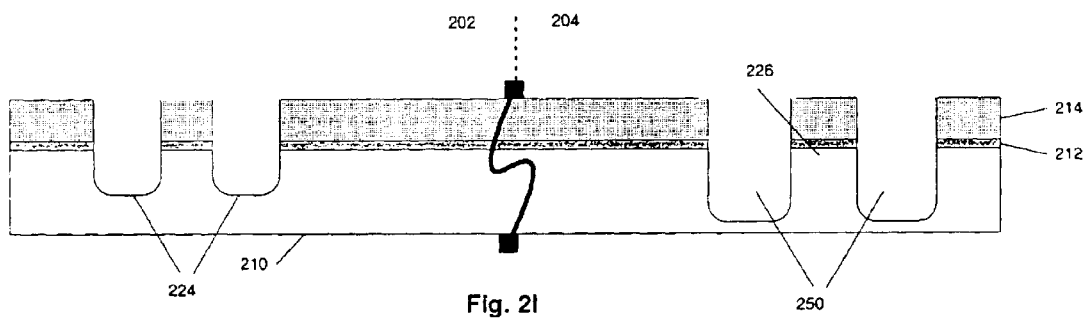
Figure 2J:
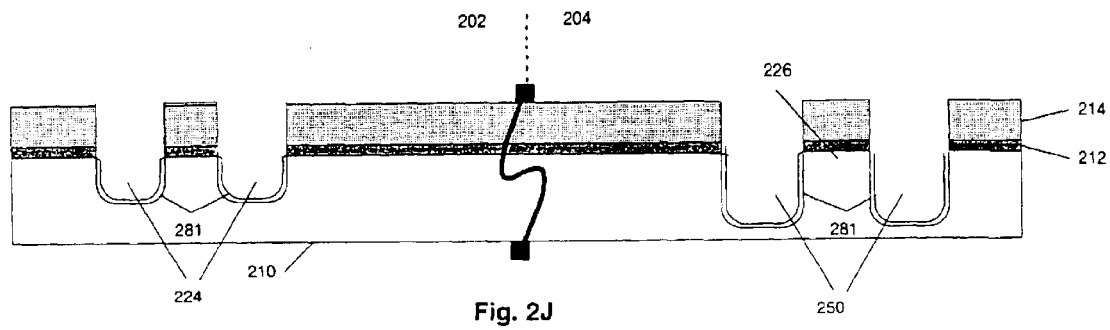

Next, as shown in FIG. 2I, the photoresist 230 is removed resulting in a substrate 210 with trenches of different depths, both shallow 224 and deep 250, that are practically perfectly aligned to each other. A thin thermal oxide 281 can then be grown over the sidewalls of the trenches 224 and 250, as shown in FIG. 2J. The nitride layer 214 acts as a barrier to oxygen and prevents the oxidation of the active regions 226 as the thermal oxide 281 is grown. Consequently, the nitride layer 214 acts as an oxidation barrier.

Figure 2K:
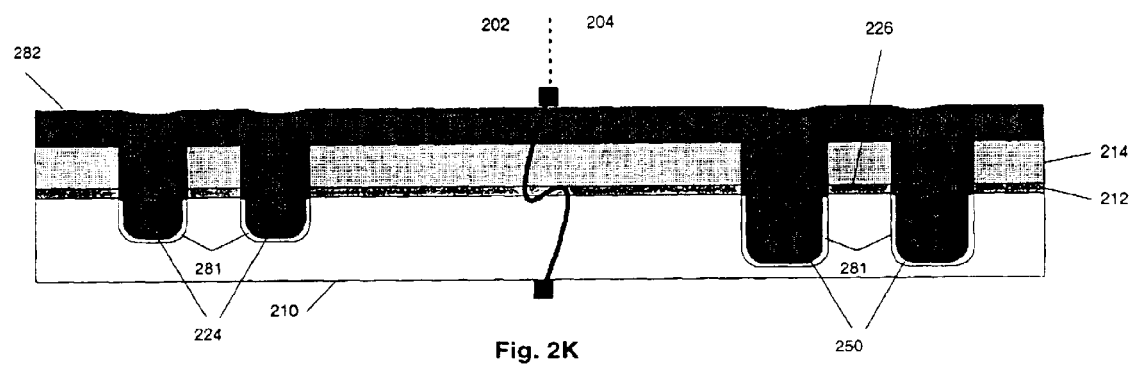
Figure 2L:
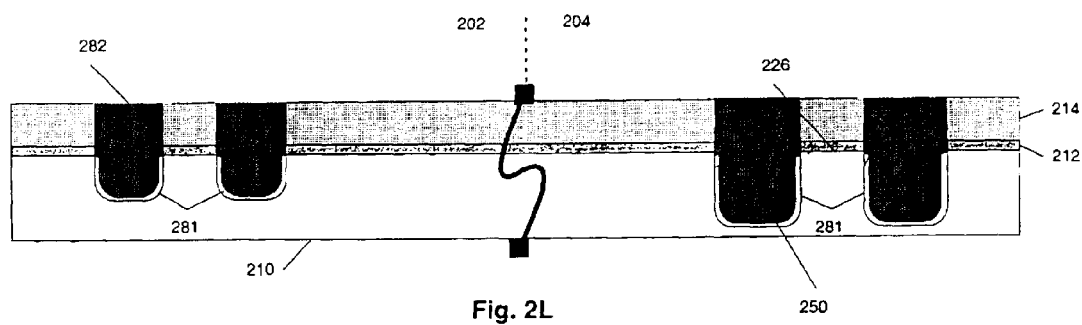

Next, as shown in FIG. 2K, a trench fill material 282 such as silicon oxide, is blanket deposited by chemical vapor deposition (CVD) over the nitride layer 214 and the thermal oxide layer 281 in the trenches 224 and 250. In one embodiment of the invention, the trench fill material 282 is silicon dioxide formed by a sequential deposition/etch/deposition process or by a simultaneous deposition-etch process, such as a high density plasma (HDP) process. The wafer is then polished back by chemical mechanical polishing, until the trench fill material 282 is substantially planar with the nitride layer 214, as shown in FIG. 2L.

Figure 2M:
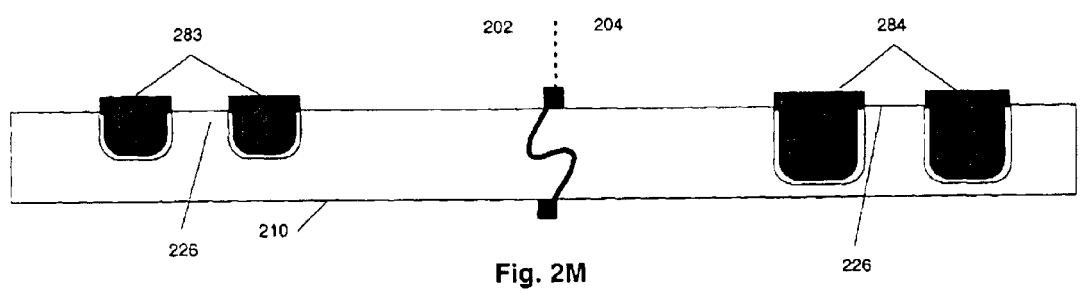

Next, as shown in FIG. 2M, the nitride layer 214 and the pad oxide layer 212 are removed with well know techniques to form shallow isolation regions 283 and deep isolation regions 284.

Figure 3A:
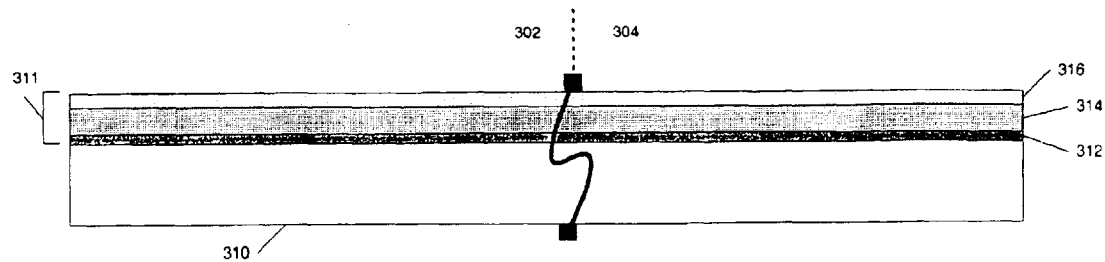
FIGS. 3A–3M represent another embodiment of a method of forming self-aligned shallow and deep isolation trenches, according to the present invention.

FIGS. 3A–3M represent another embodiment of a method of forming self-aligned shallow and deep isolation trenches. The method begins, as shown in FIG. 3A, by forming a mask layer 311 on a substrate 310, with the substrate 310 having first and second regions, 302 and 304. The substrate 310, in one embodiment of the invention, may be a monocrystalline silicon substrate, but, can be other types of substrates. Just as described in the embodiments of FIGS. 2A–2M, the mask layer 311 has several functions, such as an etch-stop layer, a polish-stop layer, and an oxidation barrier. However, in this embodiment of the invention, the mask layer 311 may include an anti-reflection layer 316, or ARC layer for short, deposited over a nitride layer 314. A pad oxide layer 312 may be thermally grown on the substrate 310 and a silicon nitride layer 314 formed on the pad oxide layer 312. The pad oxide layer 312 is to relieve stress between the substrate 310 and the nitride layer 314. The nitride layer 314, therefore, would function as the etch-stop layer, the polish-stop layer, and the oxidation barrier layer. Therefore, in the embodiments discussed in conjunction with FIGS. 3A–3M, the term "ARC layer" will synonymously replace the term "mask layer"; however, it should be understood that the mask layer 311 may be any other material, other than an anti-reflective layer, that can act as an etch stop, a polish stop, or an oxidation barrier during the subsequently described processes.

Figure 3B:
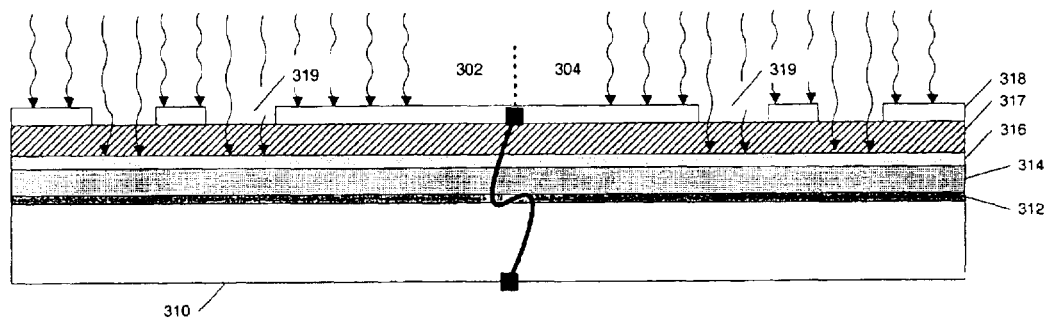

The method continues, as shown in FIG. 3B, with forming a first photoresist layer 317 over the ARC layer 316. According to well known photolithography techniques, a reticle 318 is positioned over the photoresist layer 317, wherein the reticle 318 has openings 319 formed therein according to a pre-determined design. The photoresist layer 317 is then exposed to a form of light energy, typically photonic or ultraviolet light, wherein the light energy changes the composition of the photoresist layer 317 directly underneath the openings 319. During this process, the light energy will tend to reflect off any material underlying the photoresist layer 317. The reflection of the light energy causes the light energy to errantly expose portions of the photoresist layer to the sides of the openings 319. This errant exposure is undesirable and lead to a subsequent photoresist mask with slight errors in it. These errors tend to detrimentally affect the design tolerance of the circuit.

The ARC layer 316, however, is made of a material that limits reflection of the light energy so that photoresist to the sides of the openings 319 is not exposed, thus resulting in a much more clean and precise photoresist mask 320, as described in FIG. 3C below. Exemplary ARC layer 316 materials, therefore, include an oxide, or oxide/oxynitride composite, between approximately 200 Å to 600 Å thick.

Figure 3C:
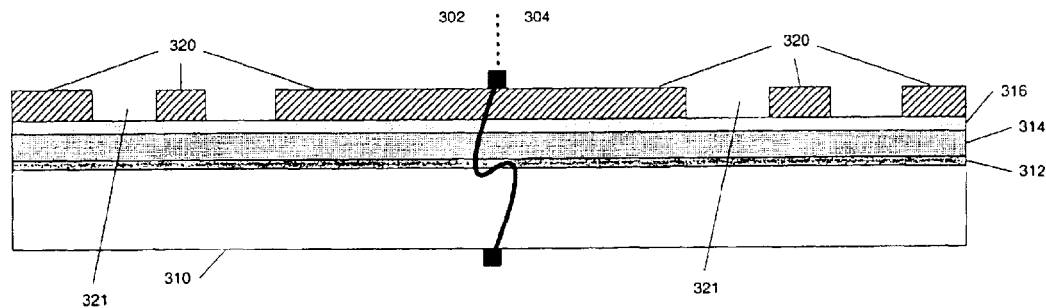

The photoresist layer is developed, according to typical lithography techniques, as shown in FIG. 3C, to form a photoresist-mask layer 320 over the first and second regions, 302 and 304. Openings 321 in the photoresist-mask layer 320 define locations where isolation trenches will subsequently be formed.

Figure 3D:
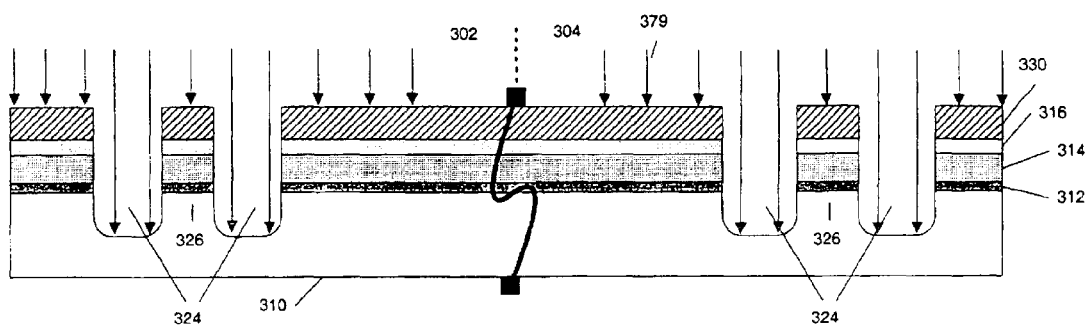

In one embodiment of the invention, the photoresist mask layer 329 is patterned using a critical lithography process. The method continues, as shown in FIG. 3D, with etching the ARC layer 316, the nitride layer 314, the pad oxide layer 312, and the substrate 310, between the openings 321, to a first depth, to form a plurality trenches 324 in the substrate. Etchant 379 should be able to etch through the ARC layer 316, the nitride layer 314, the pad oxide layer 312, and the substrate 310 underneath the openings 321. If the substrate 310 is silicon, etchant 379 should be able to etch through silicon. Furthermore, the photoresist-mask layer 320 protects the underlying ARC layer 316, nitride layer 314, pad oxide layer 312, and substrate 310 where there are no openings. Consequently, photoresist mask layer 320 should be resistant to etchant 379. In one embodiment of the invention, etchant 379 may utilize several different chemistries such as HBr, C2F6, CHF3 for etching the ARC layer 316, HBr, C2F6, CHF3 for etching the nitride layer 214, HBr, C2F6, CHF3, for etching the pad oxide layer 212, and HBr, Cl2, CF4, He and O2 for etching the silicon substrate 210. One skilled in the art will recognize, however, that any variety of different etch chemistries may be employed.

The plurality of trenches 324 define a plurality of substrate structures 326 covered by the pad oxide layer 312, the nitride layer 314, the ARC layer 316, and the photoresist-mask layer 320. In one embodiment of the invention, transistor devices will subsequently be built on the substrate structures 326, hence substrate structures 326, may also be referred to herein as "active regions" or regions whereupon active devices will be built. In one embodiment of the invention, the trenches 324 should be etched to between approximately 1000 Å to 3000 Å in depth.

Figure 3E:
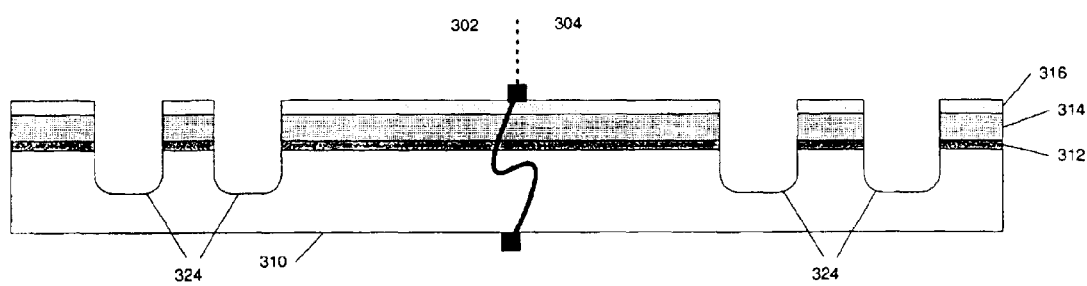
Figure 3F:
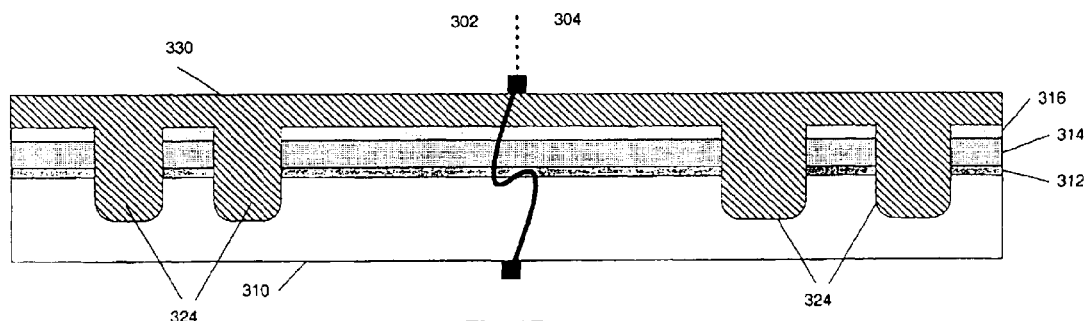

The method continues with removing the photoresist-mask layer 320, as shown in FIG. 3E, and depositing a second photoresist layer 330 over the first area 302 and second area 304, as shown in FIG. 3F.

Figure 3G:
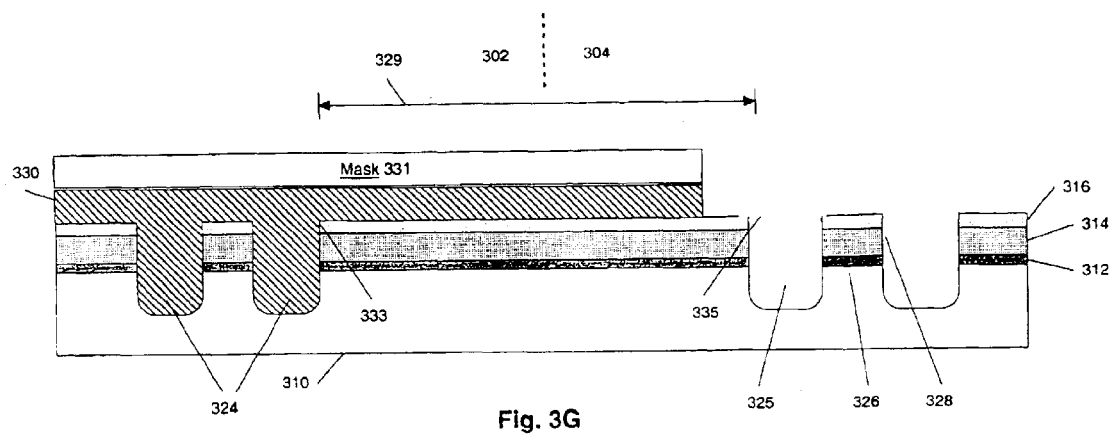

Next, as shown in FIG. 3G, photoresist 330 is masked, exposed and developed, according to conventional photolithography techniques, so that the trenches 324 in the first area 302 are covered and the trenches 324 in the second area 304 are exposed. Just as described in conjunction with FIGS. 2A–2M above, an advantage of the present invention is that the masking of the second photoresist layer 330 can be done using a non-critical lithography process. The distance 329 between the edge 333 of the last trench in the first area 302 and the edge 335 of the first trench in the second area 304 is relatively large. Therefore, the mask 331 can be aligned to the edge 333 of the last trench in the first area 302 and positioned with an overlay error as much as the distance 329 and still cover the trenches in the first area 302 while leaving the trenches in the second area 304 uncovered. Consequently, there can be significant overlay error when aligning the mask 331 over the photoresist layer 330. As long as the distance 329 is not smaller than the allowable error produced by a non-critical mask, currently 150 nm to 300 nm, then the second photoresist layer 330 can be aligned and positioned with a non-critical lithography process. One skilled in the art will recognize, however, that design tolerances will improve in time, and that the invention is not limited to the tolerances available to current lithographic processes.

Figure 3H:
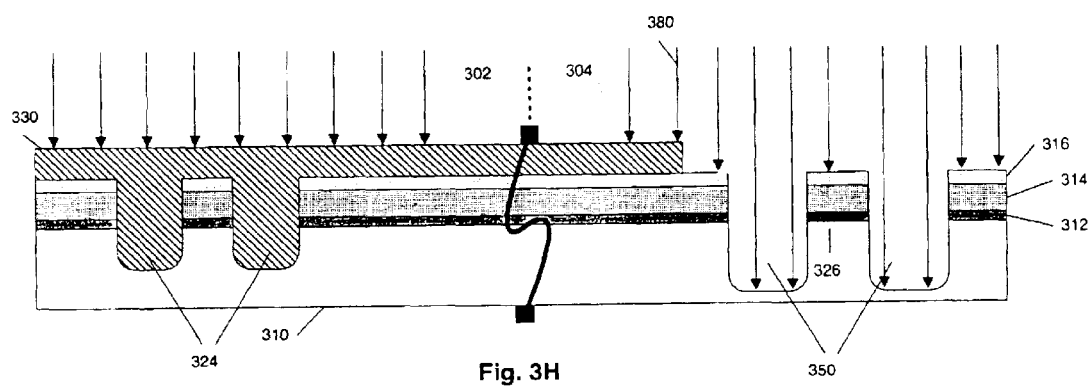

The method continues, as shown in FIG. 3H, with etching the exposed trenches 324 in the second area 304 to a second depth, to form deep trenches 350. Therefore, the method has produced shallow trenches 324 and deep trenches 350 that are perfectly aligned to each other. There was no need for a critical lithography process to align the deep trenches 350 to the shallow ones 324.

In one embodiment of the invention, the deep trenches 350 should be etched to between approximately 3000 Å to 6000 Å deep. Deep trenches 350 may be referred to as "deep isolation trenches," while the shallow trenches 324 may be referred to as "shallow isolation trenches."

During the etching of the deep trenches 350, the ARC layer 316 protects the active regions 326 in the second area 304 from being etched, while the photoresist layer 330 protects everything in the first area 302 from being etched. Essentially, the ARC layer 316 acts as a mask layer to the enchants 380, so that the active regions 326 are not etched. Thus, the second photoresist layer 330, formed in the last step, does not need to cover the second area 304, only the first area 302, so that the substrate 310 in the shallow trenches 324 is not etched away by etchant 380, and shallow trenches 324 can maintain their shallow depth. The substrate 310 in the second area 304, however, is exposed to the etchant 380, and is therefore etched to a deeper depth. Therefore, the chemistry of the etchant 380 must be able to etch the substrate material (e.g. silicon) yet at the same time not etch the ARC layer 316 or the photoresist layer 330. An exemplary etch chemistry for etchant 380 includes HBr, Cl2, CF4, He and O2, but is not limited to such.

Figure 3I:
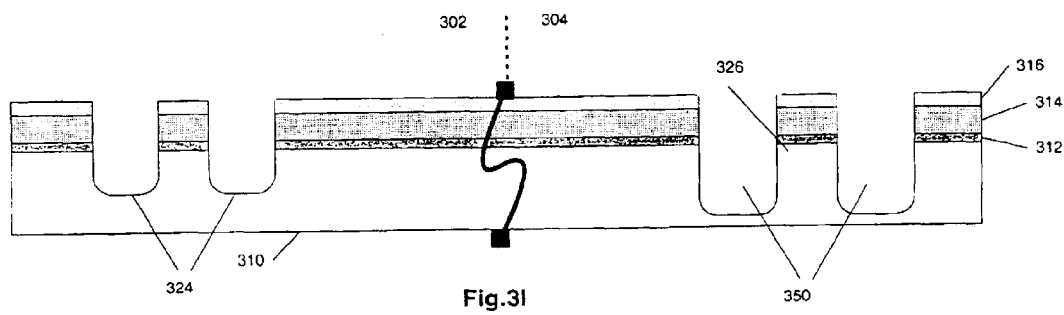
Figure 3J:
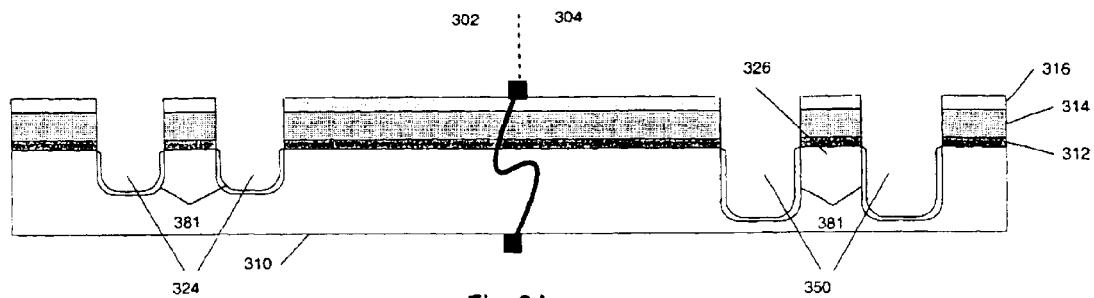

Next, as shown in FIG. 3I, the photoresist 330 is removed resulting in a substrate 310 with trenches of different depths, both shallow 324 and deep 350, that are practically perfectly aligned to each other. A thin thermal oxide 381 can then be grown over the sidewalls of the trenches 324 and 350, as shown in FIG. 3J. The ARC layer 316, or the nitride layer 314, act as a barrier to oxygen and prevents the oxidation of the active regions 326 as the thermal oxide 381 is grown.

Figure 3K:
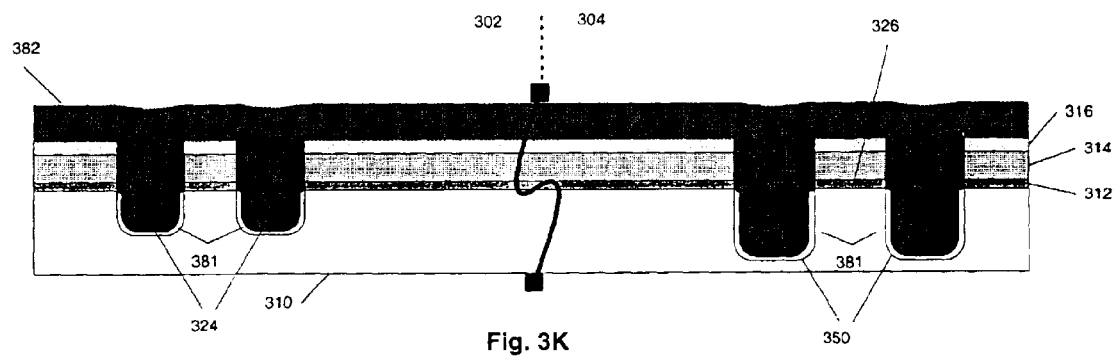
Figure 3L:
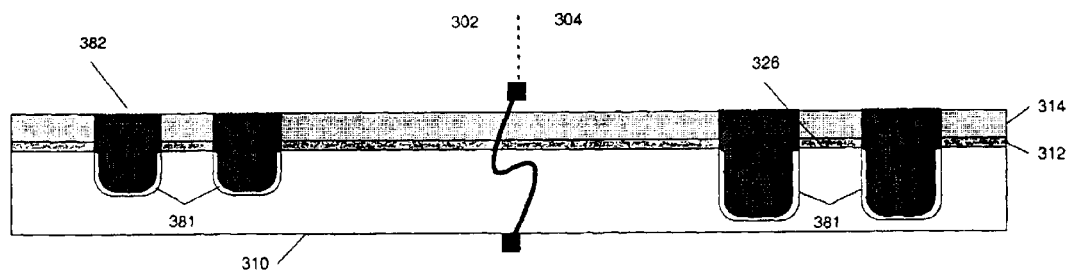

Next, as shown in FIG. 3K, a trench fill material 382 such as silicon oxide, is blanket deposited by chemical vapor deposition (CVD) over the ARC layer 316 and the thermal oxide layer 381 in the trenches 324 and 350, completely filling the trenches 324 and 350. In one embodiment of the invention, the trench fill material 382 is silicon dioxide formed by a sequential deposition/etch/deposition process or by a simultaneous deposition-etch process, such as a high density plasma (HDP) process. The wafer is then polished back by chemical mechanical polishing to provide a substantially planar wafer surface. The ARC layer 316 may be mostly, or completely, removed, during the polish, hence leaving substantially planar wafer surface as shown in FIG. 3L.

Figure 3M:
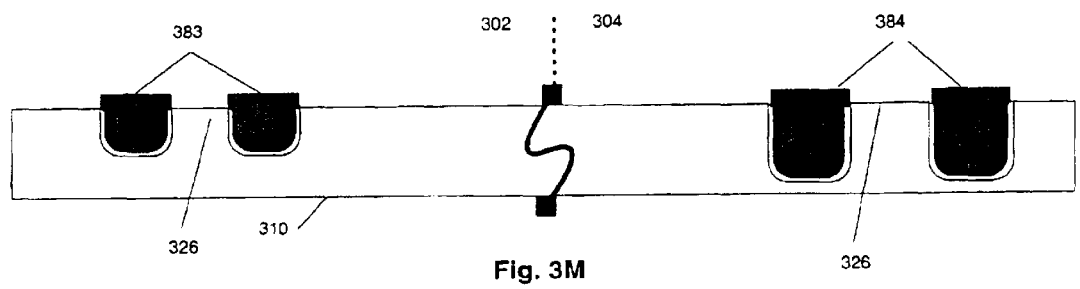

Next, as shown in FIG. 3M, any remaining portion of the ARC layer 316, the nitride layer 314 and the pad oxide layer 312 are removed with well know techniques to form shallow isolation regions 383 and deep isolation regions 384.

Apparatus

Figure 4A:
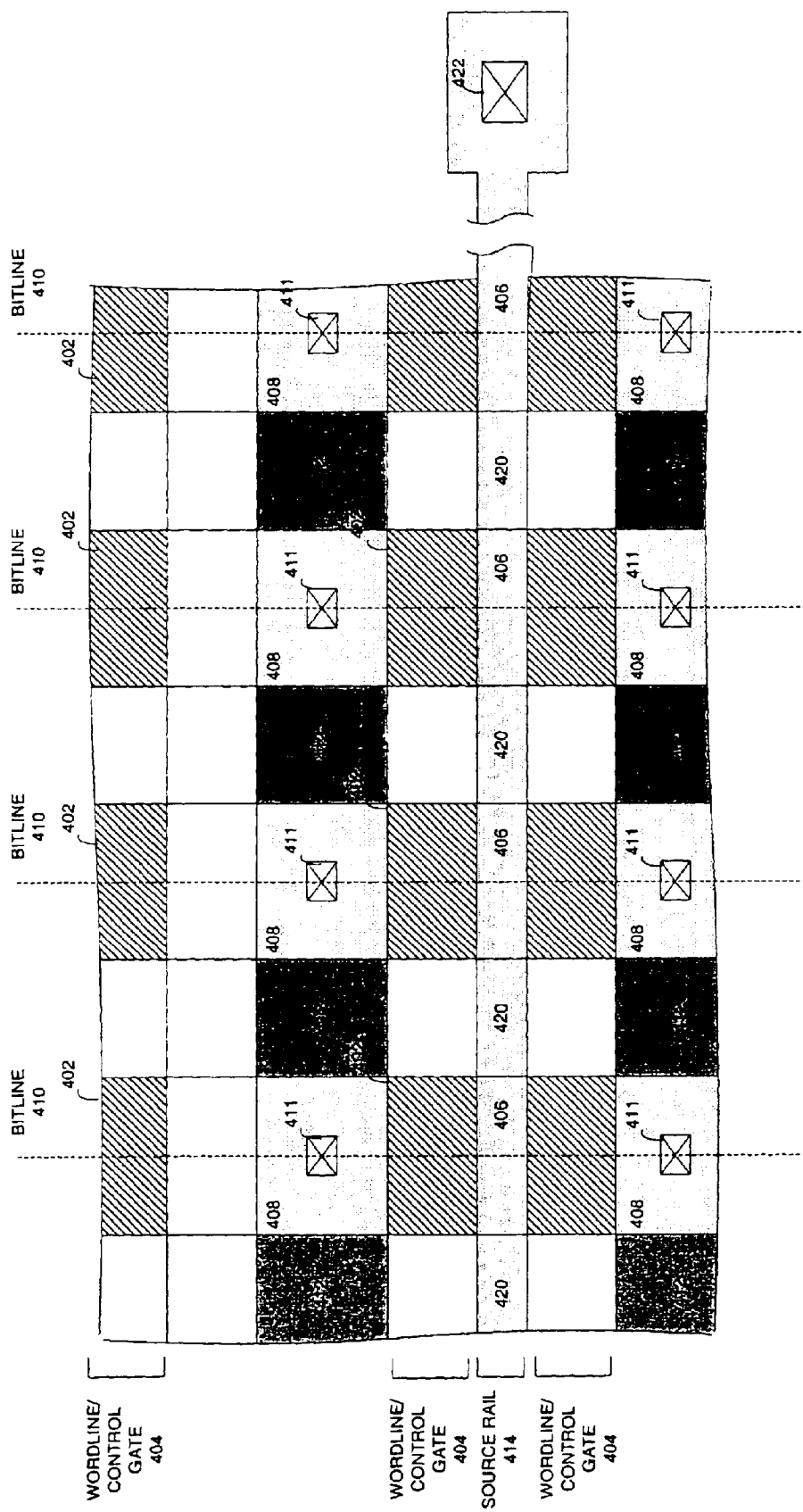
FIGS. 4A–F are diagrams of a memory array formed subsequent to the formation of shallow and deep isolation regions.
Figure 4B:
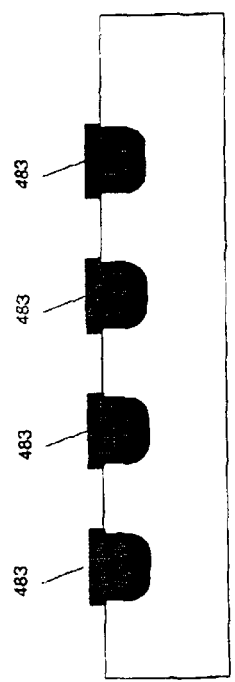

FIGS. 4A–F are diagrams of a memory array formed subsequent to the formation of the shallow and deep isolation regions as described above. FIG. 4A illustrates an overhead view of a portion of a flash memory block 400 of a flash memory integrated circuit. It is to be appreciated that the layout of FIG. 4A is just one example of many possible different array configurations for memory devices. The layout of FIG. 4A enables a high density placement of memory cells. Each block 400 comprises a plurality of flash cells laid out in a plurality of rows and columns. Each flash cell comprises a lower floating gate 402, an interpoly dielectric (not shown), a control gate 404, a source region 406 and a drain region 408. A common control gate 404 (or wordline) couples all flash cells or a row together while a common bit line 410, couples all the drains 408 of a column of flash cells together. The bit lines are formed in a first level metallization and uses contacts 411 to couple the drains together.

Figure 4C:
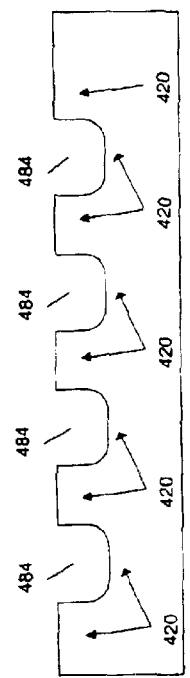
Figure 4D:
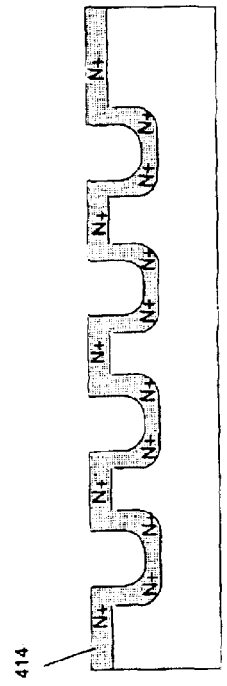

As shown in FIG. 4A, each flash cell shares a source 406 with an adjacent flash cell in the column and shares a drain 408 with the other adjacent cell in the column. Shallow trench isolation regions 412 isolate a column of flash cells from an adjacent column of flash cells. A common source rail 414, which runs parallel to the wordline direction, couples a row of shared source regions 406 together. Shown in FIG. 4B, the common source rail 414 is formed through the isolation regions by removing the portion 416 of the isolation region 412 between the shared source regions 406 prior to implanting ions (N+) for the formation of source regions 406. The result are openings 484 along the wordline direction, as shown in FIG. 4C. Then, a source implant can dope substrate region 420, in the openings 484, so that the common source regions 406 in a row are coupled together as shown in FIG. 4D. Referring back to FIG. 4A, the source rail 414 thereby requires only a single contact 422 to be made for every two rows of flash cells (e.g., second and third rows). Since the source rail 414 is used to couple the shared source regions 406 together, individual contacts are not necessary at the shared source regions enabling minimum spacing to be utilized between adjacent memory cells having a common source thereby decreasing the length of the memory cells. If isolation regions 412 were formed utilizing only a single trench scheme, then they would have needed to be formed deeper, leading to the possibility of discontinuities or high resistance in the dopant (N+) material.

Figure 4E:
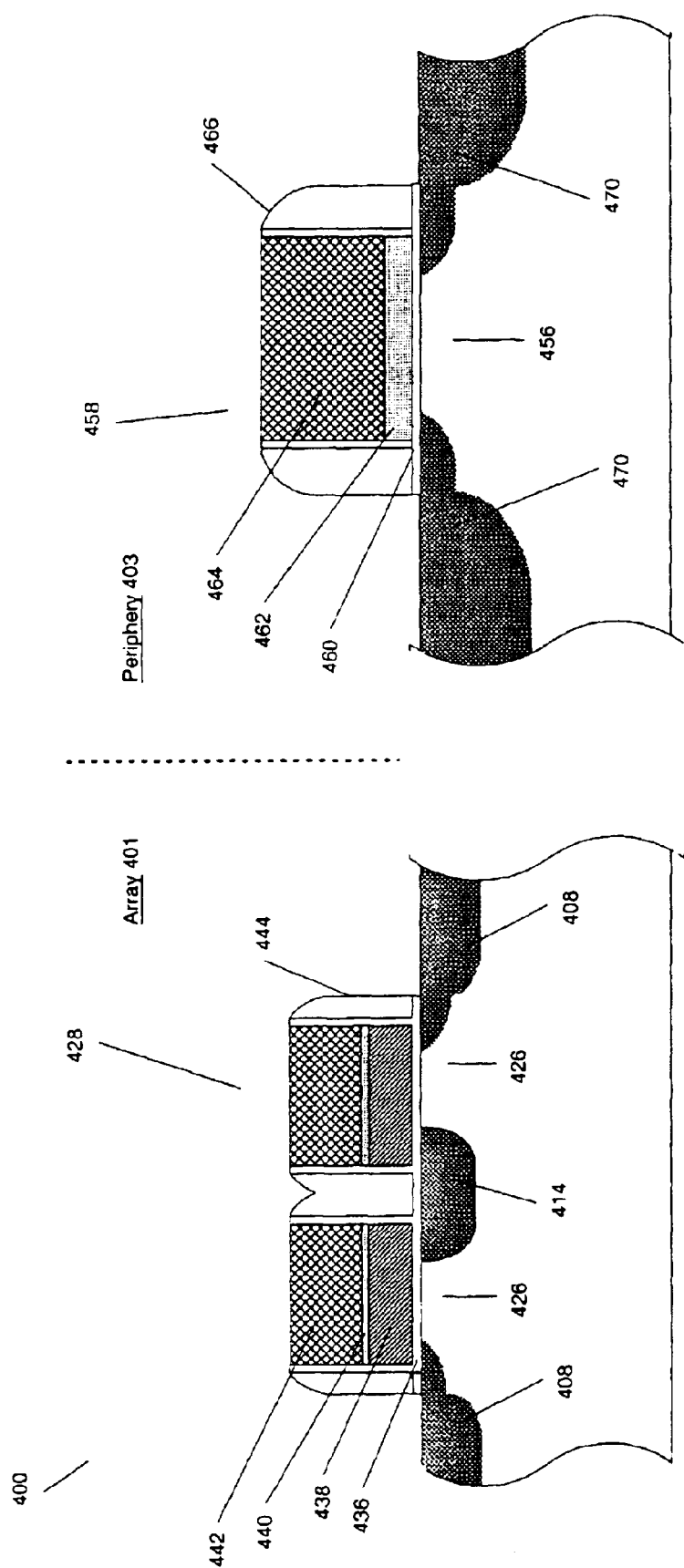

FIG. 4E is an illustration of the cell block 400 along the bitline direction. On active regions 426 are built memory devices 428, such as flash-memory devices 428. The flash memory cells 428 may share a common source rail 414, which is one advantage of having shallow trenches in the array 401. The common source rail 414 would suffer from excessive resistance if the isolation regions in the array 401 were deep like the isolation regions in the periphery 403. On active regions 426 in the periphery area 403 are built logic devices 458 that may require high-voltage to operate. It is advantageous to have deep trenches in the periphery, to properly isolate the high voltage logic devices 458.

Flash memory devices 428 may be formed by any well know methods, and may include a gate dielectric layer 436, a floating gate 438, an oxide layer 440, a control gate 442, thin dielectric spacers 444, drain regions 408, and a shared source region 406. Logic devices 458, may be other types of transistors formed by any well know method in the art, that read, write, or in other ways control the memory devices 428 in the memory array area 401. In one embodiment of the invention, the logic devices 458 may include a gate dielectric layer 460 (e.g. silicon dioxide), an oxide 462, a gate electrode 464 (e.g. polysilicon or metal), thick dielectric spacers 466, source/drain regions 470.

Figure 4F:
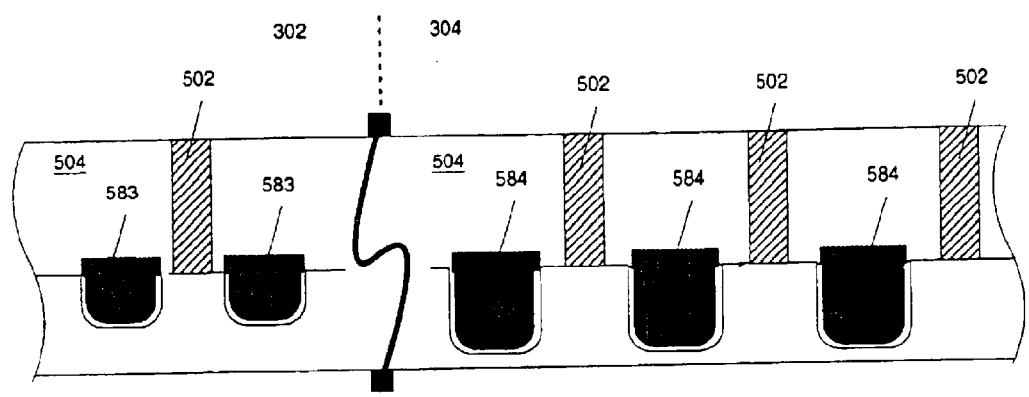

FIG. 4F, is an illustration of the cell block 400 along the wordline direction. FIG. 4F illustrates metal contacts 502 formed subsequent to the formation of the shallow and deep isolation regions as described above. Referring to FIG. 4F, an interlayer dielectric (ILD) 504 is formed over the periphery 503 and array 501 regions, covering the shallow isolation regions 583, the deep isolation regions 584, and the active regions between the isolation regions. Then, the ILD may be etched and metal contacts 502 may be formed therein. An advantage of creating dual trenches (shallow and deep) in the embodiments described above is that the contacts 502 can be perfectly placed on the active regions without having to factor mis-registration into the design tolerance. In other words, when the contacts are aligned to the active regions in the memory array region, they will be aligned to the active regions in the periphery regions as well. As a result, active region width can be tighter in the periphery, consequently leading to more active devices being placed in the periphery 503.

Several embodiments of the invention have thus been described. However, those skilled in the art will recognize that the invention is not limited to the embodiments described, but can be practiced with modification and alteration within the spirit and scope of the appended claims that follow.

What is claimed is:

1. An isolation structure, comprising:

a first area and a second area;

a plurality of shallow isolation trenches in the first area; and a plurality of deep isolation trenches in the second area, wherein the deep isolation trenches and the shallow isolation trenches are self-aligned using a single photolithography step and at least one shallow isolation trench has a width equal to or greater than the width of at least one deep isolation trench.

2. The isolation structure of claim 1, wherein the plurality of shallow trenches are between approximately 1000 Å to 2000 Å in depth.

3. The isolation structure of claim 1, wherein the plurality of deep isolation trenches are between approximately 3000 Å to 6000 Å in depth.

4. The isolation structure of claim 1, wherein the first area includes memory devices.

5. The isolation structure of claim 4, wherein the memory devices comprise flash memory devices.

6. The isolation structure of claim 1, wherein the second area includes logic devices.

7. The isolation structure of claim 1, wherein the second area includes only deep isolation trenches.

8. The isolation structure of claim 1, further comprising:

a thin thermal oxide in the shallow isolation trenches.

9. The isolation structure of claim 1, further comprising:

a trench fill material in the shallow isolation trenches.

10. The isolation structure of claim 1, further comprising:

a first active region in the first area; and a second active region in the second area.

11. The isolation structure of claim 10, further comprising:

a mask layer on the first active region.

12. The isolation structure of claim 11, wherein the mask layer comprises a pad oxide layer and a nitride layer.

13. The isolation structure of claim 12, wherein the mask layer comprises an antireflective coating.

14. The isolation structure of claim 1, further comprising:

a photoresist layer covering the first area, wherein the photoresist layer leaves the second area exposed.

15. An apparatus comprising:

a substrate having shallow isolation trenches in a first area and deep isolation trenches in a second area, wherein the deep and shallow isolation trenches are self-aligned using a single photolithography step; and a photoresist layer covering the first area and leaving the second area exposed.

16. The apparatus of claim 15, wherein the substrate comprises monocrystalline silicon.

17. The apparatus of claim 15, wherein the shortest distance between a shallow isolation trench and an adjacent deep isolation trench is greater than the allowed error of a non-critical photolithography mask.

18. The apparatus of claim 17, wherein the allowed error is in the range of about 150 to 300 nm.

19. The apparatus of claim 15, further comprising:

a first active region in the first area; and a second active region in the second area.

20. The apparatus of claim 15, further comprising:

a mask layer on the first active region, wherein the mask layer comprises a pad oxide layer and a nitride layer.

21. The apparatus of claim 15, wherein the mask layer comprises an antireflective coating.

22. An apparatus comprising:

a substrate including a first area and a second area;

a plurality of shallow isolation trenches in the first area;

a plurality of deep isolation trenches in the second area, wherein the deep isolation trenches and the shallow isolation trenches are self-aligned using a single photolithography step and at least one shallow isolation trench has a width equal to or greater than the width of at least one deep isolation trench;

a plurality of memory devices in the first area; and a plurality of logic devices in the second area.

23. The apparatus of claim 22, wherein the memory devices comprise flash memory devices.

24. The apparatus of claim 23, wherein the logic devices comprise transistors to control the flash memory devices.

* * * * *